(12) United States Patent
Jin

(10) Patent No.: US 10,446,617 B2
(45) Date of Patent: Oct. 15, 2019

(54) OLED DISPLAY PANEL AND DISPLAY DEVICE WITH SHARED COLOR SUB PIXELS

(71) Applicant: Shenzhen China Star Optoelectronics Semiconductor Display Technology Co., Ltd., Shenzhen, Guangdong (CN)

(72) Inventor: Yufeng Jin, Guangdong (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 32 days.

(21) Appl. No.: 15/745,355

(22) PCT Filed: Jul. 5, 2017

(86) PCT No.: PCT/CN2017/091844
§ 371 (c)(1),
(2) Date: Jan. 16, 2018

(87) PCT Pub. No.: WO2018/232786
PCT Pub. Date: Dec. 27, 2018

(65) Prior Publication Data
US 2019/0096961 A1 Mar. 28, 2019

(51) Int. Cl.
*H01L 29/08* (2006.01)
*H01L 33/00* (2010.01)
(Continued)

(52) U.S. Cl.
CPC ...... *H01L 27/3218* (2013.01); *H01L 51/5237* (2013.01)

(58) Field of Classification Search
CPC ............. H01L 27/3218; H01L 27/3211; H01L 27/3216; H01L 27/326; H01L 27/14607
See application file for complete search history.

(56) References Cited

U.S. PATENT DOCUMENTS

| 8,330,352 B2 * | 12/2012 | Sung | ............... H01L 27/3218 |
| | | | 313/504 |
| 9,946,123 B2 * | 4/2018 | Huangfu | ........... G02F 1/134336 |

(Continued)

FOREIGN PATENT DOCUMENTS

| CN | 104319283 A | 1/2015 |
| CN | 104637987 A | 5/2015 |

(Continued)

*Primary Examiner* — Alonzo Chambliss
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure discloses an Organic Light Emitting Diode (OLED) display panel including pixel units arranged in a array, the pixel units arranged in a array divided into a plurality of same pixel blocks, and the pixel blocks including a first to a fourth column sub pixels which are arranged and combined to form a first to a third column pixel units; wherein the first column sub pixels are disposed in the first column pixel units, the second and the third column sub pixels are disposed in the second column pixel units, and the fourth column sub pixels are disposed in the third column pixel units; each pixel unit of the second column pixel units is provided with three color sub pixels; and each pixel unit of the first and the third column pixel units is only provided with one or two of three color sub pixels.

18 Claims, 2 Drawing Sheets

(51) Int. Cl.
   *H01L 31/00*   (2006.01)
   *H01L 21/00*   (2006.01)
   *H01L 27/32*   (2006.01)
   *H01L 51/52*   (2006.01)

(56) References Cited

U.S. PATENT DOCUMENTS

| | | | | |
|---|---|---|---|---|
| 2008/0001525 A1* | 1/2008 | Chao | ............... | H01L 27/3218 |
| | | | | 313/500 |
| 2013/0234917 A1* | 9/2013 | Lee | ............... | H01L 27/3218 |
| | | | | 345/82 |
| 2014/0226323 A1 | 8/2014 | Huang et al. | | |
| 2016/0126296 A1* | 5/2016 | Feng | ............... | H01L 27/3218 |
| | | | | 257/40 |
| 2016/0155781 A1* | 6/2016 | Chaji | ............... | H01L 27/3218 |
| | | | | 257/89 |
| 2016/0357076 A1* | 12/2016 | Huangfu | ........... | G02F 1/134336 |
| 2018/0088260 A1* | 3/2018 | Jin | ............... | G02F 1/134309 |
| 2019/0140030 A1* | 5/2019 | Huangfu | ............ | G09G 3/3233 |

FOREIGN PATENT DOCUMENTS

| | | | |
|---|---|---|---|
| CN | 105047092 A | 11/2015 | |
| CN | 106097898 A | 11/2016 | |
| CN | 106469743 A | 3/2017 | |

\* cited by examiner

OLED DISPLAY PANEL AND DISPLAY DEVICE WITH SHARED COLOR SUB PIXELS

CROSS-REFERENCES TO RELATED APPLICATIONS

This application is a U.S. national phase application, pursuant to 35 U.S.C. § 371, of PCT/CN2017/091844, filed Jul. 5, 2017, designating the United States, which claims priority to Chinese Application No. 201710476915.3, filed Jun. 21, 2017. The entire contents of the aforementioned patent applications are incorporated herein by this reference.

TECHNICAL FIELD

The present disclosure relates to a technical field of a flat panel display, especially an Organic Light Emitting Diode (OLED) display panel and a display device.

BACKGROUND ART

A flat panel display device has many advantages of a thin body, power saving, non-radiation, and the like, and has been widely applied. The existing panel display device mainly includes a Liquid Crystal Display (LCD) and an Organic Light Emitting Diode (OLED) display device.

In a full-color method of an OLED display, a Color filter (CF for short) method and a red, green and blue (three basic colors are Red, Green and Blue, RGB for short) pixel method are two methods which have been developed more maturely at present.

A color filter method in an OLED display panel field is similar to the full-color display color filter method in the liquid crystal panel field, that is, an OLED emitting white light as a backlight plate performs a function of the backlight plate and a liquid crystal molecular in the liquid crystal panel, and a color filter is further disposed thereon to implement red, green and blue sub pixels, such that problems of resolution and great area preparation can be solved well. However, since there will be greater energy loss after light pass through the color filter, power consumption of the display panel will be increased.

An RGB pixel method is generally used in order to effectively reduce the power consumption of the display panel. The OLED display panel uses an RGB pixel juxtaposition method which includes pixel units disposed in a array, each of the pixel units includes a red sub pixel unit R, a green sub pixel unit G and a blue sub pixel unit B sequentially arranged in a horizontal direction, and all sub pixel units of the OLED display panel are arranged in a matrix, wherein each of the sub pixel units includes a display region and a non-display region. In particular, the display region of each of the sub pixel units includes a cathode, an anode and an electroluminescent layer (an organic emission layer), wherein the electroluminescent layer is located between the cathode and the anode to generate light with predetermined color so as to implement display. The electroluminescent layer is generally formed on the OLED display panel by means of evaporation. When preparing the display panel in the prior art, it usually needs using an evaporation with process three times to form the electroluminescent layer having a corresponding color (red, green or blue) in the display region of the pixel unit with the corresponding color, respectively.

With the development of technology, a requirement for resolution of the OLED display panel by a user is higher and higher, a distance between the sub pixels is smaller and smaller, difficulty of the preparation process is greater and greater accordingly, and the traditional RGB pixel arrangement has been unable to satisfy the design requirement for high resolutions of products.

SUMMARY

In view of lack existing in the prior art, the present disclosure provides an Organic Light Emitting Diode (OLED) display panel, wherein a new red, green, blue (RGB) sub pixel arrangement method is used, and a display panel having a higher resolution is obtained.

In order to achieve the above purpose, the present disclosure adopts the following technical solutions:

An OLED display panel includes pixel units arranged in a array being divided into a plurality of same pixel blocks, wherein the pixel blocks include a first to a fourth column sub pixels which are arranged and combined to form a first to a third column pixel units; wherein the first column sub pixels are disposed in the first column pixel units, the second and the third column sub pixels are disposed in the second column pixel units, and the fourth column sub pixels are disposed in the third column pixel units; each pixel unit of the second column pixel units is provided with a first color sub pixel, a second color sub pixel and a third color sub pixel, respectively, to form a three primary color pixel unit; and each pixel unit of the first and the third column pixel units is only provided with one or two of the first color sub pixel, the second color sub pixel and the third color sub pixel, and forms a three primary color pixel unit by sharing a sub pixel in a pixel unit adjacent thereto of the second column pixel units.

In each pixel unit of the second column pixel units, the first and the second color sub pixels are located in the same column sub pixels, and the third color sub pixel is located in another different column sub pixels.

In the first and the third column pixel units: part of the pixel units are only provided with the first and the second color sub pixels, and form three primary color pixel units by sharing the third color sub pixel in a pixel unit adjacent thereto of the second column pixel units; and another part of the pixel units are only provided with the third color sub pixel, and form three primary color pixel units by sharing the first and the second color sub pixels in pixel units adjacent thereto of the second column pixel units.

An area size defined by each of the pixel units is the same.

The first color sub pixel is a red sub pixel, the second color sub pixel is a blue sub pixel, and the third color sub pixel is a green sub pixel.

In the first to the fourth column sub pixels, an odd column sub pixels and an even column sub pixels are arranged in dislocations, so that two adjacent sub pixels in a row direction are located in different horizontal lines.

In the odd column sub pixels, respective sub pixels are sequentially and repeatedly arranged in a column direction according to an order of the first color sub pixel, the second color sub pixel and the third color sub pixel; and in the even column sub pixels, respective sub pixels are sequentially and repeatedly arranged in a column direction according to an order of the third color sub pixel, the first color sub pixel and the second color sub pixel.

The present disclosure further provides a display device which includes a housing and a driving unit and a display unit encapsulated in the housing, wherein the display unit is the OLED display panel as stated above.

According to the OLED display panel provided in the embodiment of the present disclosure, a new RGB sub pixel arrangement method is adopted, one or two colors of sub pixels are only provided in part of the pixel units, and form three primary pixel units by sharing sub pixels in the pixel units adjacent thereto, thereby a display panel having a higher resolution can be obtained. Since the number of the sub pixels is reduced on the whole, a distance between the sub pixels can be disposed to be greater, which can reduce process difficulty of the preparation, improve aperture ratios of the sub pixels, and thereby enhance display quality of the display panel.

DETAILED DESCRIPTION OF EXEMPLARY EMBODIMENTS

Figure 1:
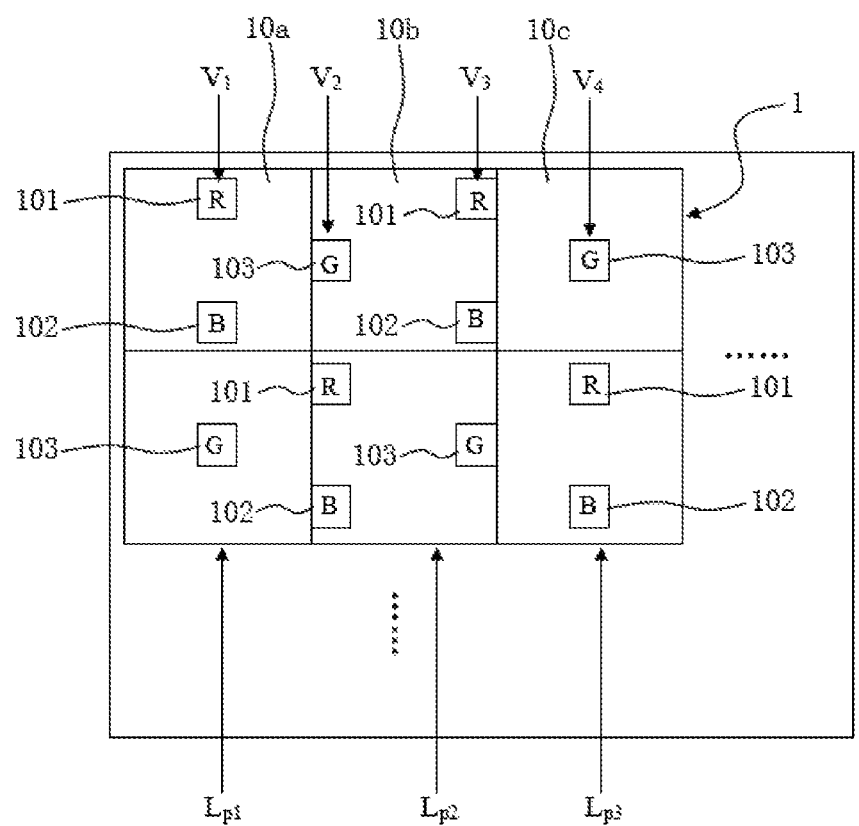
FIG. 1 is a schematic structure diagram of an OLED display panel provided by an embodiment of the present disclosure.

In order for the purpose, technical solutions and advantages of the present disclosure to be clearer, specific implementations of the present invention will be explained below in detail in conjunction with drawings. Examples of these preferred implementations are illustrated in the drawings. The implementations of the present disclosure as illustrated in the drawings and as described according to the drawings are only exemplified, and the present disclosure is not limited to these implementations.

Here, it also needs to explain that, the drawings only illustrate structures and/or processing steps closely related to the solutions of the present disclosure in order to avoid blurring the present disclosure due to unnecessary details, and other details having less relationship with the present disclosure are omitted.

The present embodiment firstly provides an Organic Light Emitting Diode (OLED) display panel. As illustrated in FIG. 1, the OLED display panel includes pixel units 10a, 10b and 10c arranged in a array (a matrix array including a plurality of rows and a plurality of columns) being divided into a plurality of same pixel blocks 1, wherein the pixel blocks 1 include a first to a fourth column sub pixels $V^1$-$V_4$ which are arranged and combined to form a first to a third column pixel units $L_{P1}$-$L_{P3}$. Referring to FIG. 1, the whole OLED display panel pixel arrangement may be deemed to be obtained by repeatedly arranging the pixel blocks 1 in a row direction and a column direction many times.

In the present embodiment, as illustrated in FIG. 1, the first column sub pixels $V_1$ are correspondingly disposed in the first column pixel units $L_{P1}$, the second column sub pixels $V_2$ and the third column sub pixels $V_3$ are correspondingly disposed in the second column pixel units $L_{P2}$, and the fourth column sub pixels $V_4$ are correspondingly disposed in the third column pixel units $L_{P3}$. Each pixel unit 10b of the second column pixel units $L_{P2}$ is provided with a first color sub pixel 101, a second color sub pixel 102 and a third color sub pixel 103, respectively, which form a three primary color pixel unit. Each pixel unit 10a and each pixel unit 10c of the first and the third column pixel units $L_{P1}$ and $L_{P3}$ are only provided with one or two of the first color sub pixel 101, the second color sub pixel 102 and the third color sub pixel 103, and respectively share a sub pixel in the pixel unit 10b adjacent thereto of the second column pixel units $L_{P2}$ to form a three primary color pixel units.

More specifically, referring to FIG. 1, in each pixel unit 10b of the second column pixel units $L_{P2}$, the first color sub pixel 101 and the second color sub pixel 102 are located in the same column sub pixels (located in the second column sub pixels $V_2$ or the third column sub pixels $V_3$ simultaneously), while the third color sub pixel 103 is located in the other column sub pixels (the corresponding third column sub pixels $V_3$ or second column sub pixels $V_2$) different therefrom. In the first column pixel units $L_{P1}$: part of the pixel units 10a are only provided with the first color sub pixel 101 and the second color sub pixel 102, and share the third color sub pixel 103 in the pixel units 10b adjacent thereto of the second column pixel units $L_{P2}$ to form three primary color pixel units; and another part of the pixel units 10a of the first column pixel units $L_{P1}$ are only provided with the third color sub pixel 103, and share the first color sub pixel 101 and the second color sub pixel 102 in the pixel units 10b adjacent thereto of the second column pixel units $L_{P2}$ to form three primary color pixel units. Similarly, in the third column pixel units $L_{P3}$: part of the pixel units 10c are also only provided with the first color sub pixel 101 and the second color sub pixel 102, and share the third color sub pixel 103 in the pixel units 10b adjacent thereto of the second column pixel units $L_{P2}$ to form three primary color pixel units; and another part of the pixel units 10c of the third column pixel units $L_{P3}$ are also only provided with the third color sub pixel 102, and share the first color sub pixel 101 and the second color sub pixel 102 in the pixel units 10b adjacent thereto of the second column pixel units $L_{P2}$ to form three primary color pixel units.

According to the OLED display panel provided in the above embodiment, a new RGB sub pixel arrangement method is adopted, one or two colors of sub pixels are only provided in part of the pixel units, and sub pixels in the pixel units adjacent thereto are shared to form three primary pixel units, thereby a display panel having a higher resolution can be obtained.

In some embodiments, area sizes defined by each of the pixel units 10a, 10b and 10c are the same. Since only one or two color sub pixels are disposed in part of the pixel units 10a and 10c, the number of the sub pixels is reduced on the whole, a distance between the respective sub pixels can be disposed to be greater, which reduces process difficulty of the preparation, improves aperture ratios of the sub pixels, and thereby enhances the display quality of the display panel. In another embodiment, since only one or two color sub pixels are disposed in part of the pixel units 10a and 10c, areas defined by the pixel units 10a and 10c can also be smaller (an area smaller than that of the pixel unit 10b), on the contrary, that is, a larger number of pixel units can be disposed in the display panel having the same area, thereby a resolution of the display panel also can be improved.

More particularly, in the present embodiment, referring to FIG. 1, the first color sub pixel 101 is a red sub pixel R, the second color sub pixel 102 is a blue sub pixel B, and the third color sub pixel 103 is a green sub pixel G In the first to the fourth column sub pixels $V_1$-$V_4$, an odd column sub pixels $V_1$, $V_3$ and an even column sub pixels $V_2$, $V_4$ are arranged in dislocations, so that two adjacent sub pixels in a row direction are located in different horizontal lines. As illustrated in FIG. 1, from the sub pixel array in the whole OLED display panel, the sub pixels of the odd column sub pixels $V_1$, $V_3$ are located in an odd row, while the sub pixels of the even column sub pixels $V_2$, $V_4$ are located in an even row. Of course, in another embodiment, it also can be disposed that the sub pixels of the odd column sub pixels $V_1$, $V_3$ are located in an even row, while the sub pixels of the even column sub pixels $V_2$, $V_4$ are located in an odd row. The above arrangement methods can further increase the distance between the respective sub pixels and reduce the process difficulty.

More particularly, in the present embodiment, referring to FIG. 1, in the odd column sub pixels $V_1$, $V_3$, the respective sub pixels are sequentially and repeatedly arranged in a column direction according to an order of the first color sub pixel (the red sub pixel R), the second color sub pixel (the blue sub pixel B) and the third color sub pixel (the green sub pixel G). In the even column sub pixels $V_2$, $V_4$, the respective sub pixels are sequentially and repeatedly arranged in a column direction according to an order of the third color sub pixel (the green sub pixel G), the first color sub pixel (the red sub pixel R) and the second color sub pixel (the blue sub pixel B). As stated in the above arrangement method, the sub pixels adjacent to and surrounding each sub pixel are not sub pixels that have the same colors with the each sub pixel, thereby borrowing (sharing) the sub pixels can be implemented more easily, and a vision resolution is improved by sharing the surrounding pixels. For example, taking the red sub pixel R in the second column sub pixels $V_2$ as an example, if the red sub pixel R is a central point, six sub pixels are included in the surrounding of the red sub pixel, connection lines among the sub pixels form a hexagon, the six sub pixels are located at top points of the hexagon and include three blue sub pixels B and three green sub pixels G, and the three blue sub pixels B and the three green sub pixels G are sequentially arranged on the top points of the hexagon at intervals from each other. As disposed above, the periphery of each sub pixel is surrounded by other color sub pixels, and sharing the sub pixels is easily implemented.

Figure 2:
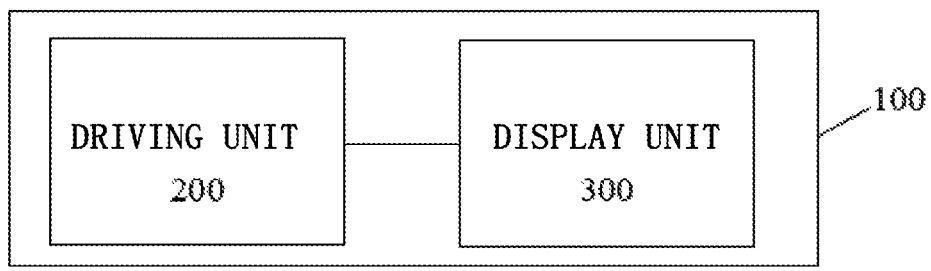
FIG. 2 is a schematic structure diagram of a display device provided by an embodiment of the present disclosure.

Furthermore, the present embodiment further provides a display device, as illustrated in FIG. 2, the display device includes a housing 100 and a driving unit 200 and a display unit 300 encapsulated in the housing 100, wherein the OLED display panel provided in the present embodiment is adopted by the display unit 300, and the driving unit 200 provides a driving signal to the display unit 300 to allow the display unit 300 display an image.

In summary, according to the OLED display panel provided in the embodiment of the present disclosure, a new RGB sub pixel arrangement method is adopted, one or two colors of sub pixels are only provided in part of pixel units, and sub pixels in the pixel units adjacent thereto are shared to form three primary pixel units, thereby a display panel having a higher resolution can be obtained. Since the number of the sub pixels is reduced on the whole, a distance between the sub pixels can be disposed to be greater, which can reduce process difficulty of the preparation, and improve aperture ratios of the sub pixels, thereby enhance display quality of the display panel.

It should be explained that the relational terms, such as first, second, and the like, used herein are only used for distinguishing one entity or operation from another entity or operation, and do not necessarily require or imply any actual relation or sequence existing between these entities or operations. Moreover, the term "include", "contain" or any other variations thereof are intend to cover a non-exclusive inclusion, so that the process, method, object or device including a series of factors not only includes those factors but also includes other factors that are not explicitly listed or further include inherent factors for this process, method, object or device. In the absence of more restrictive, the factors defined by the sentence "include a . . . " do not exclude additional identical factors existing in the process, method, object or device which includes the factors.

The above statements are only the specific embodiments of the present application, it should be pointed out that, to those ordinary skilled in the art, several improvements and polish can be made without departing from the principle of the present application, also those improvements and polish should be considered as the protection scope of the present application.

What is claimed is:

1. An Organic Light Emitting Diode (OLED) display panel comprising pixel units arranged in a array, the pixel units arranged in a array being divided into a plurality of identical pixel blocks, wherein the pixel blocks comprise a first to a fourth column sub pixels which are arranged and combined to form a first to a third column pixel units, wherein the first column sub pixels are disposed in the first column pixel units, the second and the third column sub pixels are disposed in the second column pixel units, and the fourth column sub pixels are disposed in the third column pixel units;

each pixel unit of the second column pixel units is provided with a first color sub pixel, a second color sub pixel and a third color sub pixel, respectively, to form a three primary color pixel unit; and each pixel unit of the first and the third column pixel units is only provided with one or two of the first color sub pixel, the second color sub pixel and the third color sub pixel, and forms a three primary color pixel unit by sharing a sub pixel in a pixel unit adjacent thereto of the second column pixel units.

2. The OLED display panel of claim 1, wherein in each pixel unit of the second column pixel units, the first and the second color sub pixels are located in the same column sub pixels, and the third color sub pixel is located in the other column sub pixels different therefrom.

3. The OLED display panel of claim 2, wherein in the first and the third column pixel units: a part of the pixel units are only provided with the first and the second color sub pixels, and form three primary color pixel units by sharing the third color sub pixels in pixel units adjacent thereto of the second column pixel units; and another part of the pixel units are only provided with the third color sub pixels, and form three primary color pixel units by sharing the first and the second color sub pixels in pixel units adjacent thereto of the second column pixel units.

4. The OLED display panel of claim 1, wherein an area size defined by each of the pixel units is the same.

5. The OLED display panel of claim 1, wherein the first color sub pixel is a red sub pixel, the second color sub pixel is a blue sub pixel, and the third color sub pixel is a green sub pixel.

6. The OLED display panel of claim 1, wherein in the first to the fourth column sub pixels, an odd column sub pixels and an even column sub pixels are arranged in dislocations, so that two adjacent sub pixels in a row direction are located in different horizontal lines.

7. The OLED display panel of claim 6, wherein in the odd column sub pixels, respective sub pixels are sequentially and repeatedly arranged in a column direction according to an order of the first color sub pixel, the second color sub pixel and the third color sub pixel; and in the even column sub pixels, respective sub pixels are sequentially and repeatedly arranged in a column direction according to an order of the third color sub pixel, the first color sub pixel and the second color sub pixel.

8. An OLED display panel comprising pixel units arranged in a array, the pixel units arranged in a array being divided into a plurality of same pixel blocks, wherein the pixel blocks comprise a first to a fourth column sub pixels which are arranged and combined to form a first to a third column pixel units; wherein the first column sub pixels are disposed in the first column pixel units, the second and the third column sub pixels are disposed in the second column pixel units, and the fourth column sub pixels are disposed in the third column pixel units;

each pixel unit of the second column pixel units is provided with a first color sub pixel, a second color sub pixel and a third color sub pixel, respectively, to form a three primary color pixel unit; and each pixel unit of the first and the third column pixel units is only provided with one or two of the first color sub pixel, the second color sub pixel and the third color sub pixel, and forms a three primary color pixel unit by sharing a sub pixel in a pixel unit adjacent thereto of the second column pixel units;

in each pixel unit of the second column pixel units, the first color sub pixel and the second color sub pixel are located in the same column sub pixels, and the third color sub pixel is located in the other column sub pixels different therefrom;

in the first column pixel units and the third column pixel units: part of the pixel units are only provided with the first and the second color sub pixels, and form three primary color pixel units by sharing the third color sub pixels in pixel units adjacent thereto of the second column pixel units; and another part of the pixel units are only provided with the third color sub pixel, and form three primary color pixel units by sharing the first and the second color sub pixels in pixel units adjacent thereto of the second column pixel units;

in the first to the fourth column sub pixels, an odd column sub pixels and an even column sub pixels are arranged in dislocations, so that two adjacent sub pixels in a row direction are located in different horizontal lines; and in the odd column sub pixels, respective sub pixels are sequentially and repeatedly arranged in a column direction according to an order of the first color sub pixel, the second color sub pixel and the third color sub pixel; in the even column sub pixels, respective sub pixels are sequentially and repeatedly arranged in a column direction according to an order of the third color sub pixel, the first color sub pixel and the second color sub pixel.

9. The OLED display panel of claim 8, wherein, an area size defined by each of the pixel units is the same.

10. The OLED display panel of claim 8, wherein, the first color sub pixel is a red sub pixel, the second color sub pixel is a blue sub pixel, and the third color sub pixel is a green sub pixel.

11. A display device comprising a housing and a driving unit and a display unit encapsulated in the housing, the display unit being an OLED display panel comprising pixel units arranged in a array, the pixel units arranged in a array being divided into a plurality of same pixel blocks, and the pixel blocks comprising a first to a fourth column sub pixels which are arranged and combined to form a first to a third column pixel units, wherein the first column sub pixels are disposed in the first column pixel units, the second and the third column sub pixels are disposed in the second column pixel units, and the fourth column sub pixels are disposed in the third column pixel units;

each pixel unit of the second column pixel units is provided with a first color sub pixel, a second color sub pixel and a third color sub pixel, respectively, to form a three primary color pixel units; and each pixel unit of the first and the third column pixel units is only provided with one or two of the first color sub pixel, the second color sub pixel and the third color sub pixel, and forms a three primary color pixel unit by sharing a sub pixel in a pixel unit adjacent thereto of the second column pixel units.

12. The display device of claim 11, wherein, in each pixel unit of the second column pixel units, the first and the third color sub pixels are located in the same column sub pixels, and the second color sub pixel is located in the other column sub pixels different therefrom.

13. The display device of claim 12, wherein, in the first and the third column pixel units: part of the pixel units are only provided with the first and the second color sub pixel, and form three primary color pixel units by sharing the third color sub pixels in pixel units adjacent thereto of the second column pixel units; and another part of the pixel units are only provided with the third color sub pixels, and form three primary color pixel units by sharing the first and the second color sub pixels in pixel units adjacent thereto of the second column pixel units.

14. The display device of claim 13, wherein, in the first to the fourth column sub pixels, an odd column sub pixels and an even column sub pixels are arranged in dislocations, so that two adjacent sub pixels in a row direction are located in different horizontal lines; in the odd column sub pixels, respective sub pixels are sequentially and repeatedly arranged in a column direction according to an order of the first color sub pixel, the second color sub pixel and the third color sub pixel; and in the even column sub pixels, respective sub pixels are sequentially and repeatedly arranged in a column direction according to an order of the third color sub pixel, the first color sub pixel and the second color sub pixel.

15. The display device of claim 11, wherein, an area size defined by each of the pixel units is the same.

16. The display device of claim 11, wherein, the first color sub pixel is a red sub pixel, the second color sub pixel is a blue sub pixel, and the third color sub pixel is a green sub pixel.

17. The display device of claim 11, wherein, in the first to the fourth column sub pixels, an odd column sub pixels and an even column sub pixels are arranged in dislocations, so that two adjacent sub pixels in a row direction are located in different horizontal lines.

18. The display device of claim 17, wherein, in the odd column sub pixels, respective sub pixels are sequentially and repeatedly arranged in a column direction according to an order of the first color sub pixel, the second color sub pixel and the third color sub pixel; and in the even column sub pixels, respective sub pixels are sequentially and repeatedly arranged in a column direction according to an order of the third color sub pixel, the first color sub pixel and the second color sub pixel.

* * * * *